US008729498B2

(12) United States Patent
Fleischhacker et al.

(10) Patent No.: US 8,729,498 B2
(45) Date of Patent: May 20, 2014

(54) HIGH THROUGHPUT UV CURING SYSTEMS AND METHODS OF CURING A PLURALITY OF ARTICLES

(75) Inventors: Kevin A. Fleischhacker, Maple Grove, MN (US); Jonathan D. Anderson, Minneapolis, MN (US); Mark P. Toma, Maple Grove, MN (US)

(73) Assignee: Harland Medical Systems, Inc., Eden Prairie, MN (US)

( * ) Notice: Subject to any disclaimer, the term of this patent is extended or adjusted under 35 U.S.C. 154(b) by 114 days.

(21) Appl. No.: 13/528,718

(22) Filed: Jun. 20, 2012

(65) Prior Publication Data

US 2012/0319012 A1 Dec. 20, 2012

Related U.S. Application Data

(60) Provisional application No. 61/498,716, filed on Jun. 20, 2011.

(51) Int. Cl.
*G01N 23/00* (2006.01)
*H01J 37/20* (2006.01)

(52) U.S. Cl.
USPC ................ 250/455.11; 250/492.1; 250/494.1; 250/504 R; 362/217.01; 362/217.08; 362/217.09; 362/224; 362/230; 362/260

(58) Field of Classification Search
USPC ............... 250/453.11, 454.11, 455.11, 461.1, 250/492.1, 493.1, 494.1, 504 R, 526; 362/217.01, 217.08, 217.09, 217.1, 362/217.11–217.17, 219–225, 230, 240, 362/260, 458, 656
See application file for complete search history.

(56) References Cited

U.S. PATENT DOCUMENTS

| | | | | |
|---|---|---|---|---|
| 6,621,087 | B1 * | 9/2003 | Bisges et al. | 250/492.1 |
| 6,861,653 | B2 * | 3/2005 | Liu et al. | 250/455.11 |
| 7,935,940 | B1 * | 5/2011 | Smargiassi | 250/492.1 |
| 8,158,956 | B2 * | 4/2012 | Karunaratne et al. | 250/454.11 |
| 8,283,644 | B2 * | 10/2012 | Smargiassi et al. | 250/504 R |
| 2010/0282733 | A1 * | 11/2010 | Chin | 219/448.12 |
| 2013/0062533 | A1 * | 3/2013 | Karunaratne et al. | 250/454.11 |

* cited by examiner

*Primary Examiner* — Bernard E Souw
(74) *Attorney, Agent, or Firm* — Douglas J. Christensen

(57) ABSTRACT

High throughput UV curing systems for mass curing of a plurality of articles without compromising product quality. The systems comprise a plurality of UV banks, each bank comprising a plurality of fluorescent UV lamps, thereby creating a consistent blanket of UV energy. A plurality of coated articles are positioned between pairs of banks such that the UV exposure or dosage is evenly distributed for each article. The fluorescent UV lamps use proportionally lower energy per unit and generate less heat than standard UV lamps, while sufficiently curing the coating on each article. Throughput is increased compared to currently available systems because the systems are easier to maintain requiring less downtime, can cure significantly more articles per cycle, and reduce the number of rejected products.

19 Claims, 17 Drawing Sheets

HIGH THROUGHPUT UV CURING SYSTEMS AND METHODS OF CURING A PLURALITY OF ARTICLES

PRIORITY CLAIM

This application claims priority to U.S. Provisional Application No. 61/498,716, filed Jun. 20, 2011, and entitled "HIGH THROUGHPUT UV CURING SYSTEMS AND METHODS OF CURING A PLURALITY OF ARTICLES," which is hereby incorporated by reference in its entirety.

FIELD OF THE INVENTION

The invention relates generally to curing systems for curing coated articles. More specifically, embodiments of the invention relate to a high throughput, efficient UV curing system for curing a plurality of articles having a UV curable coating thereon.

BACKGROUND OF THE INVENTION

A number of manufactured articles require coatings over at least a portion thereof, such as primer coatings, protective coatings such as a clear or hard coatings, antimicrobial coatings, and the like. In particular, medical devices, such as, for example, catheters and guide wires, often contain specialty coatings, including hydrophilic lubricious coatings, antimicrobial coatings, and the like for optimal performance. The device or other article is coated such as by spray coating, spin coating, curtain coating, or dip coating, and is subsequently cured.

One type of coating includes a thermally curable solvent-based coating. Convection is used to drive off the solvent and cure the coating. Thermally curable coatings, however, often have long curing cycles, sometimes up to twelve hours or more, for a satisfactory or complete cure. To maximize output of coated articles, long tunnel ovens are built so that multiple articles can be moved through the tunnels at once. However, these tunnels can stretch for a hundred feet or more, in order for an article to completely cure along its path through the tunnel, or can require multiple passes to achieve cure. These tunnel ovens can be expensive, inefficient, and can result in inconsistent curing if the air flow and temperature is not closely controlled.

Infrared (IR) curable coatings are also known in the art. Infrared energy is a form of radiation, which falls between visible light and microwaves in the electromagnetic spectrum. Like other forms of electromagnetic energy, IR travels in waves and there is a known relationship between the wavelength, frequency and energy level. That is, the energy (temperature) increases as the wavelength decreases.

Unlike convection, which first heats air to transmit energy to the part, IR energy may be absorbed directly by the coating. It may also be reflected or transmitted to the substrate. IR curing results in significantly shorter cycle times than thermal cure because of its intensity. The heat generated from the IR oven also drives off any solvent and aids in the ultimate cure. However, for sufficient curing to be attained, IR curing systems can generate large amounts of heat during the cure cycle causing delicate or heat-sensitive articles, such as thermoplastic catheters, to deform or melt, and/or the coating to degrade or become over-cured such that it is brittle.

UV-curable coatings are used often for coating applications because they tend to require shorter cycle times with less heat. Ultraviolet (UV) light is electromagnetic radiation with a wavelength shorter than that of visible light, but longer than X-rays, in the range 10 nm to 400 nm. UV-A, or long wave UV, has a range of wavelengths from about 315 nm to about 400 nm. UV-B, or medium wave UV, has a range of wavelengths from about 315 nm to about 280 nm. UV-C, or short wave UV, has a range of wavelengths from about 280 nm to about 100 nm.

A UV-curable coating or resin system typically includes a photoinitiator, monomers and/or oligomers, and other components as needed. The photoinitiator, upon exposure to the UV light, decomposes to produce an abundance of free radicals. These free radicals then cause monomers or oligomers present in the coating to "open up" and combine with other monomers or oligomers to form polymers, thereby cross-linking or curing the coating. Different photointiators absorb UV light most efficiently at different wavelengths. Therefore, the UV resin or coating systems are specifically tailored to the type of lamp used, or vice versa.

UV curing is fast, and can typically be accomplished in 600 seconds or less, which permits UV ovens to be confined and compact, allowing for faster production rates than other cure methods, such as thermal cure, that require substantial oven dwell times. The quick cure also minimizes substrate heating, which is a great advantage when curing films on heat-sensitive thermoplastic substrates, such as catheters.

Cure by UV is accomplished in shielded and enclosed chambers saturated with high intensity electrically generated UV light. For total curing to take place in a UV-curable coating system, the UV light must activate as many of the photoinitiator molecules as possible, which means that the light must be exposed to all of the coating areas to be cured, and therefore, the UV light must be kept close to the part or article being cured. In UV-curable systems, the energy of the UV light decreases quickly, i.e. it decreases as a square of the distance, which quickly affects the cure of the coating. Because of this requirement, the currently available systems and methods for UV-curing of coatings suffer from the ability to be massively scaled-up to increase product throughput without compromising coating and/or product quality.

High intensity UV lamps, such as arc lamps, have been used to shorten cycle times in order to increase throughput. For example, xenon-mercury short-arc lamps have been used. In these lamps, the majority of the light is generated in a tiny, pinpoint sized cloud of plasma situated at the tip of each electrode. The light generation volume is shaped like two intersecting cones, and the luminous intensity falls off exponentially moving towards the center of the lamp. Xenon-mercury short-arc lamps have a bluish-white spectrum and extremely high UV output. Furthermore, the output of the arc lamp is not restricted to the UV power bands, and there is a substantial output in the IR band as well as the visible light band. The output in the IR band causes increased heat generation, which can deform heat-sensitive articles, and/or degrade or over-cure the coating.

UV fluorescent bulbs do not have substantial IR output, and generate significantly less heat than arc lamps. However, utilization of UV fluorescent bulbs has been minimally adopted or accepted by the industry due to the low power output of such bulbs and the belief that such bulbs cannot provide sufficient UV energy to efficiently and effectively cure UV curable coating on elongate articles.

There remains a need for a UV curing system that can be efficiently and easily scaled-up, while maintaining consistent exposure of the UV spectrum and energy seen at each article of a plurality of articles, minimizing heat applied to each article, and utilizing short dwell times to increase throughput and to improve the lifespan of the UV source.

SUMMARY OF THE INVENTION

Embodiments of the invention are directed to UV curing systems for mass curing of a plurality of articles without compromising product quality. The systems comprise a plurality of UV banks, each bank comprising a plurality or array of fluorescent UV lamps, thereby creating a consistent blanket or optimal curing zone of UV exposure at a distance spaced from the UV banks. A plurality of coated articles are positioned between pairs of banks such that the UV exposure or dosage is evenly distributed for each article. The fluorescent UV lamps use lower energy, and do not generate the heat of UV arc lamps, while sufficiently curing the coating on each article. The dwell time remains relatively short, e.g. 600 seconds or less, compared to thermally cured systems, and allows for a large capacity of product to be cured in a single cycle.

An advantage and feature of utilizing fluorescent UV generating bulbs is that the wavelength of the bulbs output can be "tuned" to the curable molecules in the coatings to optimize the output of the fluorescent bulbs and increase energy efficiency, compared to the arc lamps of the prior art.

The system and methods result in dramatic capacity expansion such that production and distribution of product can be expanded, thereby opening additional strategic markets because demand can easily be met. Further, the coating economics are improved because the system provides an unlimited ability to increase capacity of current systems due to the configuration of the light banks relative to the articles being cured, while requiring proportionally less energy per device or unit due to the use of lower powered fluorescent UV lamps. This equates to a dramatic cost per unit savings. The system minimizes the use of valuable cleanroom space, labor, chemistry, and utilities. Particularly less electricity per unit item treated and less heat generated per unit item treated directly translate to cost savings. Reducing the heat generation in a clean room setting, where these articles are typically produced, provides a very significant cost savings.

Factors driving capacity of curing systems according to embodiments of the present invention are material inputs and outputs (i.e. supply of materials and demand of market) rather than curing capabilities, expense, and physical limitations (e.g. size constraints) typical of prior art systems.

Another feature and advantage of embodiments of the invention is that more consistent curing is accomplished, and potentially a better, more predictable and/or more "tunable" coating is produced.

Furthermore, maintenance and use of certain embodiments of the system is simple. The positioning of articles and/or banks relative to one another is efficient because a large number of articles are positioned within the curing chamber simultaneously. Further, an entire bank of bulbs can be easily swapped out should failure of one or more of the bulbs of a bank occur. This is more efficient than changing out individual bulbs, and therefore minimizes downtime.

A feature and advantage of embodiments of the invention is that a side by side row of closely connected elongate cylindrical UV bulbs, comprising a bank, is contained within a frame or other structure such that the row may be handled as a single unit. This permits the entire bank to be readily removed and replaced when an energy output reduction is detected, or anticipated for maintenance purposes, minimizing downtime.

A feature and advantage of the invention is that rows of UV bulbs, or banks of bulbs, effectively provide a UV light generating "wall" such that the UV intensity or energy density (intensity×time) of the wall is greater than and more uniform due to the additive effect of the adjacent bulbs as compared to the arc lamps of the prior art. In other words, although it is known that UV energy from a point source decreases as the square of the distance from the source, where the source is effectively a wall or a plurality of sources, the energy reduction between bulbs on the wall (or the plane of the multiple sources) decreases much less than moving from a point source of UV energy due to the close proximity of the bulbs. This allows for a more uniform cure along the entire unit length of the article being cured because the UV energy profile is essentially or significantly flattened or continuous along the length and near the surface being cured due to the overlapping effect of the bulbs. Additionally, this also provides effective curing around the entirety of the article even though only two sides directly face each "wall" of UV generation.

A feature and advantage of the invention is providing opposing UV light generating walls with a row of articles supported by a pallet positioned intermediate the opposing walls. In embodiments a specific number ("x") of UV generating spaced banks provides a specific number (x−1) of curing zones. For example, ten banks of UV bulbs provide nine curing zones. A feature and advantage is that each of the internal walls or surface of each bank emits UV radiation into two different zones efficiently utilizing the power from each of the bulbs. In certain embodiments the end walls may use fewer bulbs than the internal walls with reflectors to utilize the radiation emitted from the outboard side of the bulbs and still provide substantially the same UV energy output.

Contrary to expectations, the inventors have found that utilization of UV fluorescent bulbs properly arranged as disclosed herein, i.e. side-by-side, can provide sufficient power and UV energy for efficiently and consistently curing elongate articles, particularly medical articles for insertion into the human body.

The above summary of the invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
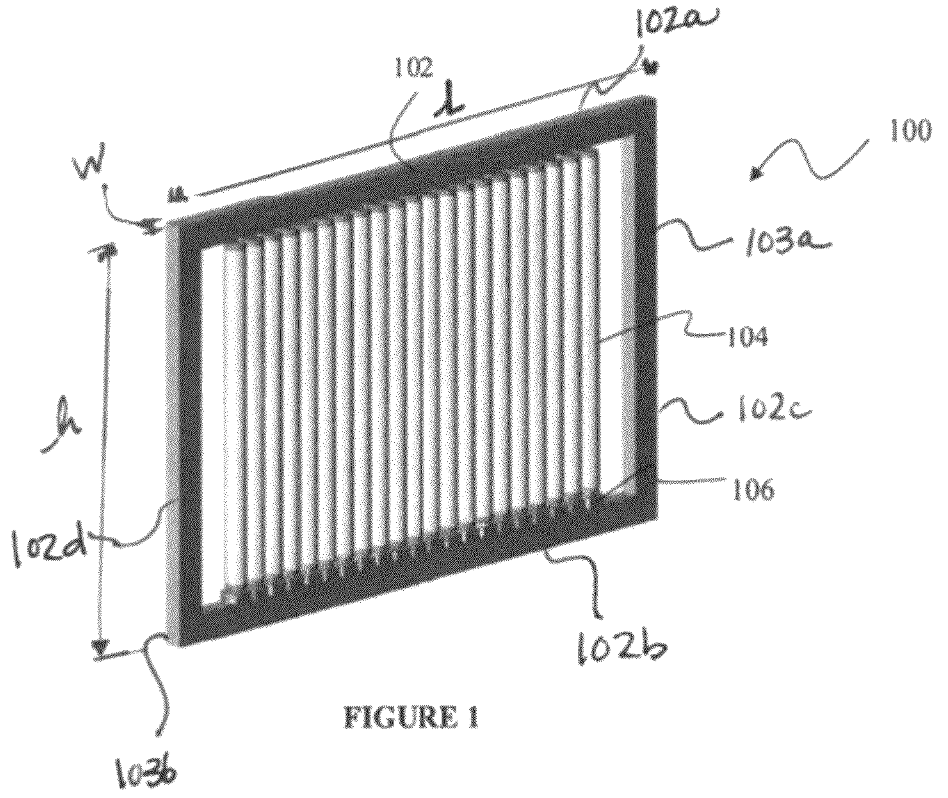
FIG. 1 is a perspective view of a bank of UV lamps according to an embodiment of the invention.

While the invention is amenable to various modifications and alternative forms, specifics thereof have been shown by way of example in the drawings and will be described in detail. It should be understood, however, that the intention is not to limit the invention to the particular embodiments described but rather to include all modifications, equivalents, and alternatives.

DETAILED DESCRIPTION OF THE DRAWINGS

A fluorescent UV curing system according to embodiments of the invention generally comprises one or more fluorescent UV banks, each bank including a plurality of fluorescent UV bulbs in a side-by-side relationship in a plane. This configuration of bulbs creates overlapping curing regions forming a total curing region at a distance spaced from the plane having a continuous or uniform curing energy along the entire curing region.

Figure 2:
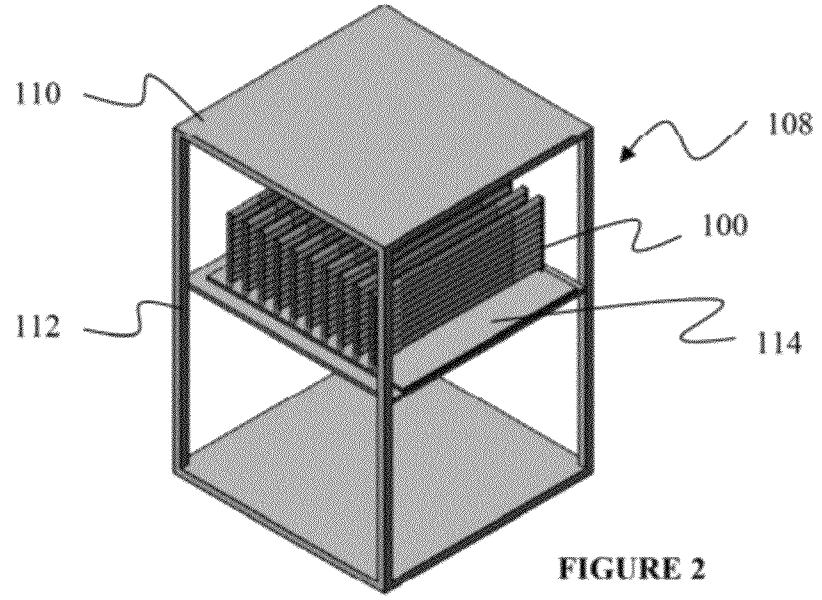
FIG. 2 is a perspective view of a curing system according to an embodiment of the invention comprising a plurality of banks according to FIG. 1 in a tray assembly.
Figure 3:
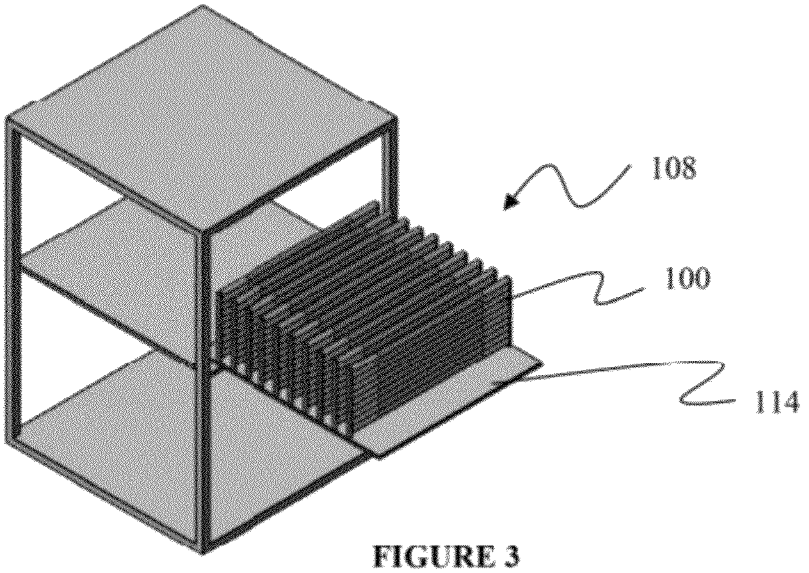
FIG. 3 is an alternative perspective view of the curing system according to FIG. 2.
Figure 4:
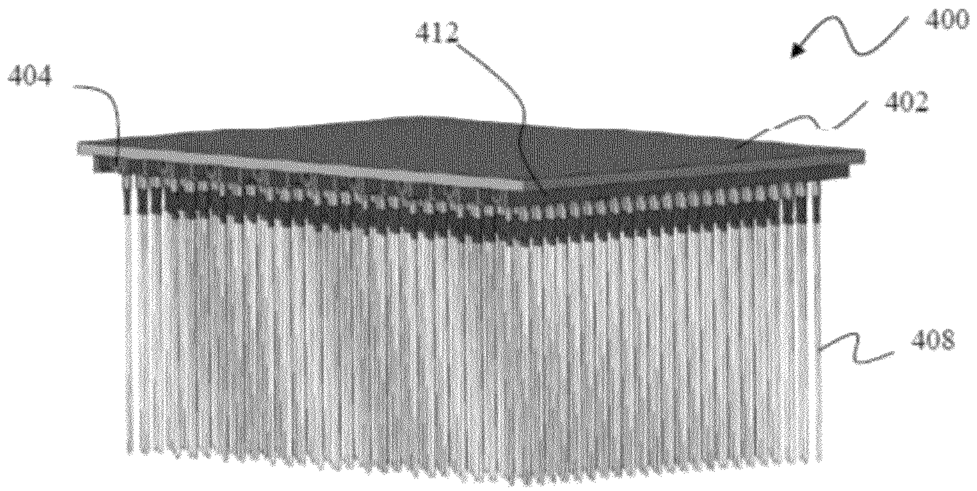
FIG. 4 is a device pallet comprising a plurality of device bars of coated articles according to an embodiment of the invention.
Figure 5:
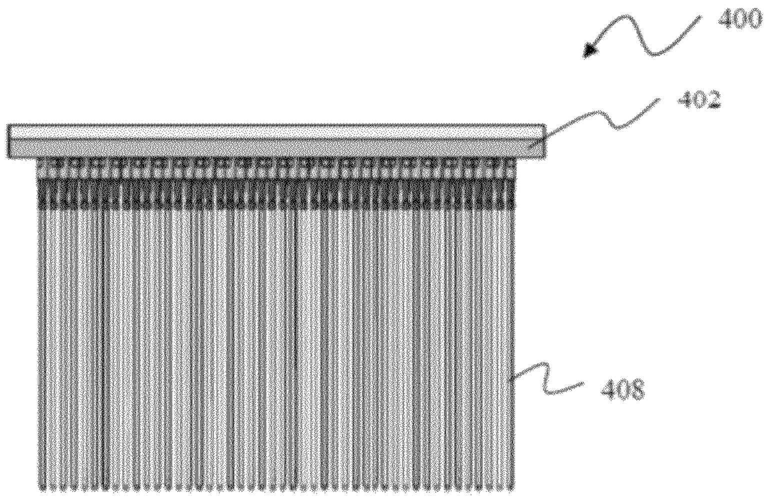
FIG. 5 is a side view of the pallet according to FIG. 4.

Referring to FIG. 1, a bank 100 of UV lamps (or bulbs) comprises a frame 102 or other support structure, and a plurality of individual fluorescent UV bulbs 104 positioned substantially parallel to one another within a framework 102. In the embodiment illustrated in FIG. 1, framework comprises of a four-sided rectangular frame having top and bottom sides 102*a* and 102*b* respectively, and sides 102*c* and 102*d* substantially perpendicular to top and bottom sides 102*a*, 102*b*; however, any of a number of support structures can be contemplated, such as, for example, a square frame, a single support bar or mandrel, or any of a variety of support structures for supporting a plurality of UV bulbs in a substantially parallel configuration. In the non-limiting embodiment illustrated in FIG. 1, bulbs 104 are substantially perpendicular to top and bottom sides 102*a*, 102*b* such that the bulbs are positioned "vertically" within frame 102. However in an alternative embodiment of the invention (such as shown in FIGS. 2-3), the bulbs are positioned substantially parallel to the top and bottoms sides of the frame such that the bulbs are positioned "horizontally" within the frame.

Referring back to FIG. 1, each bank includes a length (l), a height (h), and a width (w). The width is defined as extending between a first plane 103*a* defined as the outermost extending portions of bulbs on the first side of the bank 100 to a second plane 103*b* defined by the outermost extending portions of the bulbs on the second side of bank 100.

Each bulb 104 comprises an electrical connector (not shown). The connector can comprise a single-pin or double-pin connector on each side of bulb 104, or can comprise a four-pin connector on one side of the connector. Frame 102 comprises a plurality of corresponding outlets 106 mounted thereto for receiving the electrical connector of each bulb 104. A power supply (not shown) supplies electricity to the outlets, and ultimately bulbs 104 through outlets 106.

Bulbs 104 comprise fluorescent UV bulbs emitting a wavelength anywhere in the UV spectrum from about 100 nm (or less) to about 600 nm (or more). In one non-limiting example, bulbs 104 comprise a wavelength from about 300 to about 350. However, bulbs 104 are selected depending on the composition of the coating to be cured and the desired wavelength for providing maximum UV absorption by the photointiator.

Bulbs 104 can range in wattage anywhere from about 20 to about 150 Watts or more, the wattage being depending upon factors including, but not limited to, the length of the bulb, the selected power to the bulb, etc. Bulbs 104 can optionally be doped to change the frequency of the UV wave, in order to maximize the UV energy produced by the bulb at efficient power settings.

Fluorescent UV bulbs are advantageous in coating systems because of their relatively low power requirements compared to standard UV bulbs which results in lower energy cost and longer bulb life, and because they do not generate large amounts of heat during the curing cycle compared to standard UV bulbs. Because of the reduced heat generation of the bulb, heat dissipation issues are avoided, thereby reducing the need for sophisticated air circulation and climate control systems. The reduced infrared energy produced by UV fluorescent bulbs allow greater temperature control and more consistent UV output in the curing chamber with less effort than other UV bulbs. Furthermore, less heat generation is obviously much better for articles or coatings that are thermally degradable and the fluorescent banks herein provide less heat generation than other UV lamps that have the same or similar curing capabilities.

One non-limiting example of a fluorescent UV bulb includes a phosphor coating on the inner surface of the tube of the bulb. This phosphor coating absorbs UVC emitted by the low pressure mercury arc of the fluorescent bulb, and emits longer UV wavelengths. There are at least six different UV-emitting phosphors used in fluorescent lamps. Suitable fluorescent UV bulbs are available, for example, from Osram Sylvania of Danvers, Mass., and GE Lighting of Cleveland, Ohio.

Figure 21:
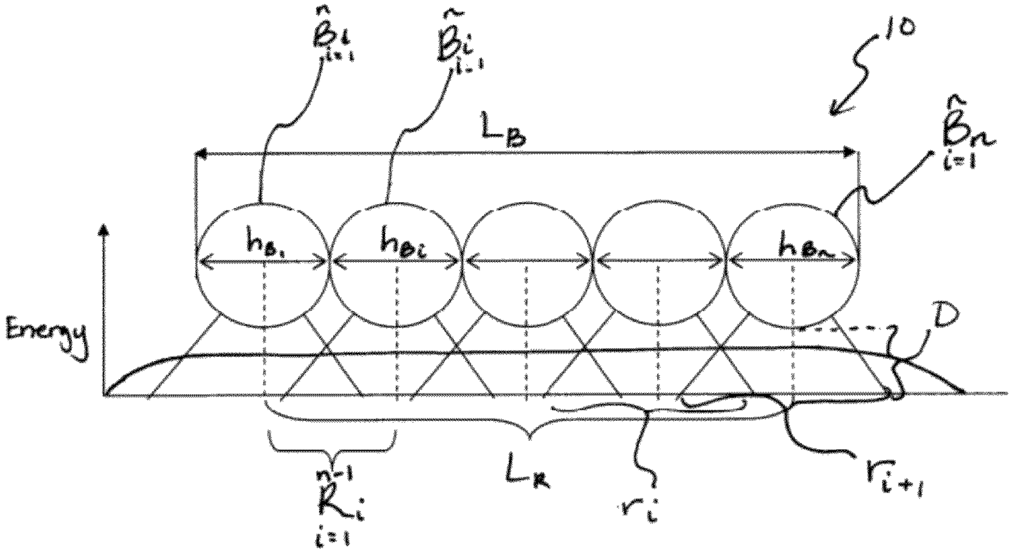
FIG. 21 is a cross-section of a bank of bulbs illustrating UV radiation on a curing surface.

Each bulb $B_i$ (where i=1 to n for a total of n bulbs) of a bank of bulbs 10 emits a region of UV radiation, such that each bank of bulbs forms a "wall" or plane of substantially uniform UV curing energy at a distance perpendicular to the bank on one or both sides of the bank, such that each bank has one or more UV projecting sides. In particular, as shown in FIG. 21, each bulb in a bank of bulbs has a bulb height $h_{Bi}$. In one example where the bulb is cylindrical, the bulb height is equal to the diameter of the bulb. Typical bulb diameters can range from about 0.5 inch to about 1.5 inches. The bulbs in the bank are arranged substantially side-by-side (including slightly staggered to one another) such that the bank has a total bank length $L_B$ defined as at least the sum of the n bulb heights $h_B$. However, the bank length $L_B$ can be greater if there is slight spacing between each bulb.

Each bulb emits UV light having a wavelength in the UV spectrum corresponding to an irradiation energy. The output of each bulb emits region of radiation "$r_i$" that widens or become less intense as distance from the bulb increases. The energy or UV intensity of the bulb decreases as the square of the distance from the source (bulb). However, due to the side-by-side configuration of the bulbs, the curing region ($r_i$) or intensity of each bulb overlaps with the curing region ($r_{i+1}$, $r_{i-1}$) of an adjacent bulb. The decreased energy of the curing region at a distance from the bulb is compensated by the overlapping curing region of the adjacent bulb, creating a substantially uniform or consistent plane or wall of curing energy at an optimum distance D from the UV projection side of bank 10, the wall extending at least a portion of the length and the height of bank 10 forming an optimal curing zone. This wall or plane is preferably where a coated surface of an article is introduced to enable consistent or uniform curing of the coating at the surface. In one embodiment, the optimum distance D of the wall ranges from about 0.1 inches to about six inches, and more particularly from about 0.5 inch to about four inches, measured from the surface of the bank to a centerline of the article being cured.

A number "n" bulbs B results in "n−1" curing regions R along bank 10. Therefore, the surface of the article to be coated is preferably no longer than a total length $L_R$ that the (n−1) curing regions extend to reduce or eliminate the lower energy ends of the bank where the curing region of each end bulb is only overlapped by a single adjacent bulb.

FIG. 2 illustrates an exemplary UV curing system 108 comprising a plurality of UV banks 100. Each bank 100 is arranged substantially parallel to one another and at a distance "d" from one other, measured from the center of one bulb of a first bank to the center of a corresponding bulb of a second, adjacent bank. The distance "d" ranges from about one inch to about twelve inches, and more particularly from about three inches to about six inches, depending on the diameter of the bulbs. The spacing between two banks is sufficient for receiving one or more coated articles to be cured therebetween in a curing zone without contacting the banks.

Figure 25:
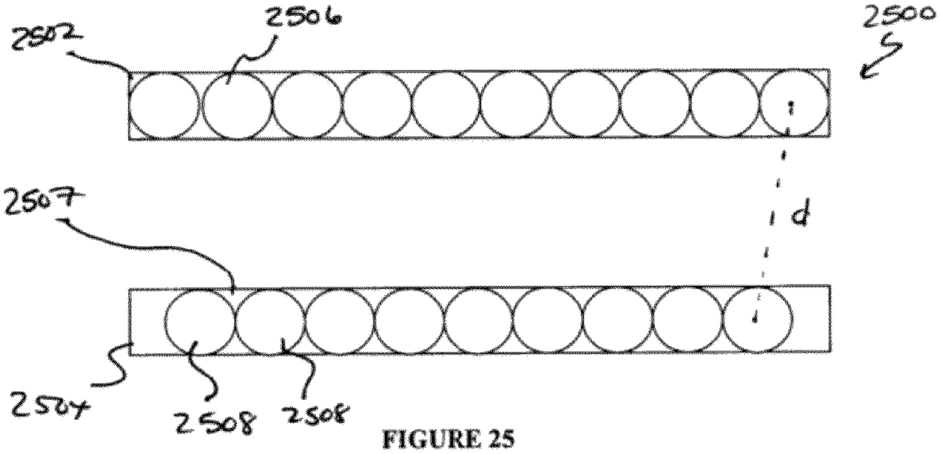
FIG. 25 is a plan view of two banks of bulbs with staggered bulb alignment.

In one embodiment, depicted in FIG. 25, a set of banks 2500 includes two adjacent banks 2502 and 2504 are arranged such that bulbs 2506 of first bank 2502 are positioned in alignment with gaps 2507 between bulbs 2508 of second bank 2504. This arrangement allows greater bulb to bulb separation but minimal gaps in the VU wall as seen by the devices being treated.

In one embodiment, a centerline of an article to be cured, such as a catheter, is spaced from about 0.1 inches to about six inches from the bulbs, and more particularly about 0.5 inch to about four inches. As illustrated in FIGS. 2 and 3, banks 100 are arranged such that bulbs 104 are in a horizontal position. However, in an alternative embodiment of the invention, the bulbs can be arranged in a vertical position, as described infra with reference to FIGS. 14-16.

Banks 100 can be positioned on a support structure 110 such as a shelving unit. In one embodiment of the invention, illustrated in FIGS. 2 and 3, structure 110 comprises a frame 112 having one or more slidable shelves 114 for housing system 108.

In embodiments a specific number ("x") of UV generating spaced banks 100 provides a specific number (x−1) of curing zones 101. For example, ten banks of UV bulbs provide nine curing zones. A feature and advantage is that each of the internal walls or surface of each bank emits UV radiation into two different zones efficiently utilizing the power from each of the bulbs. In certain embodiments the end walls may use fewer bulbs than the internal walls with reflectors to utilize the radiation emitted from the outboard side of the bulbs and still provide substantially the same UV energy output.

UV curing system 108 can be used to cure large capacities of articles in a single "pass" or curing cycle compared to existing UV systems, thereby increasing the throughput of the system. Furthermore, UV curing system 108 can be scaled to limitless sizes to accommodate a limitless number of units to be cured. The size, dimensions, and number of banks of UV curing 108 can be any of a variety, as driven by factors including material input or supply and outputs such as market demand for the articles being cured. In one particular embodiment of the invention, and for exemplary purposes only, UV curing system 108 is used for curing catheters having a coating over a least a portion thereof, such as urological catheters having a coating on the lumen portion thereof; however UV curing system 108 can be used to cure any of a number of articles and is not limited to medical devices such as catheters or guide wires.

Figure 6:
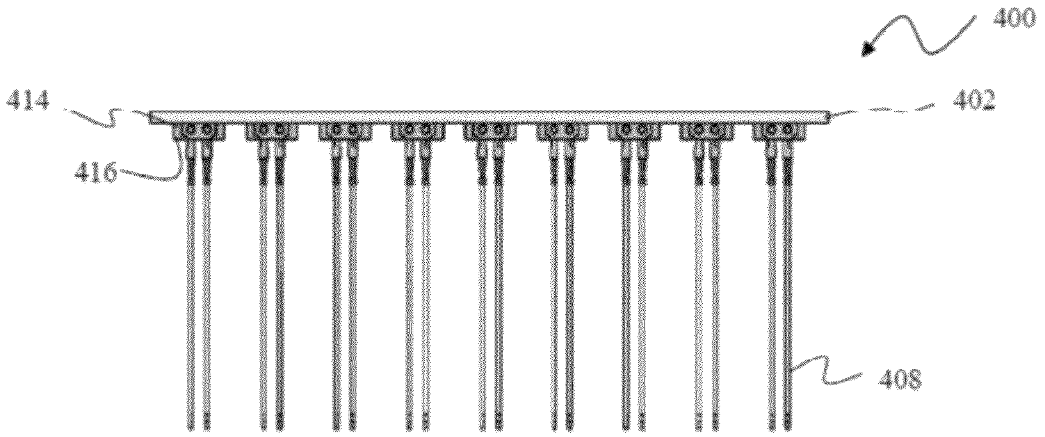
FIG. 6 is a front view of the pallet according to FIG. 4.
Figure 7:
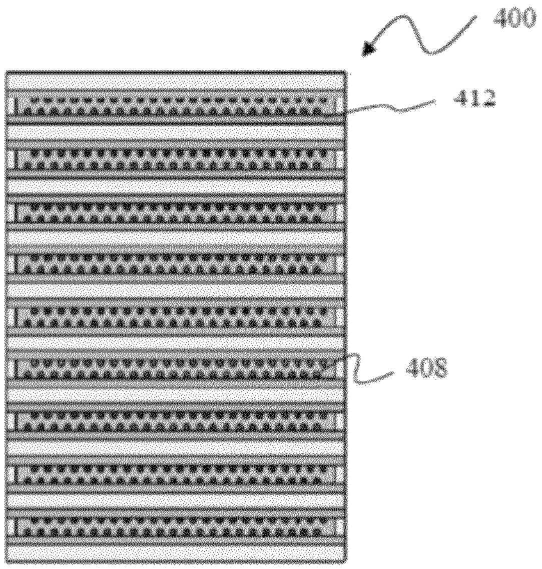
FIG. 7 is bottom view of the pallet according to FIG. 4.
Figure 8:
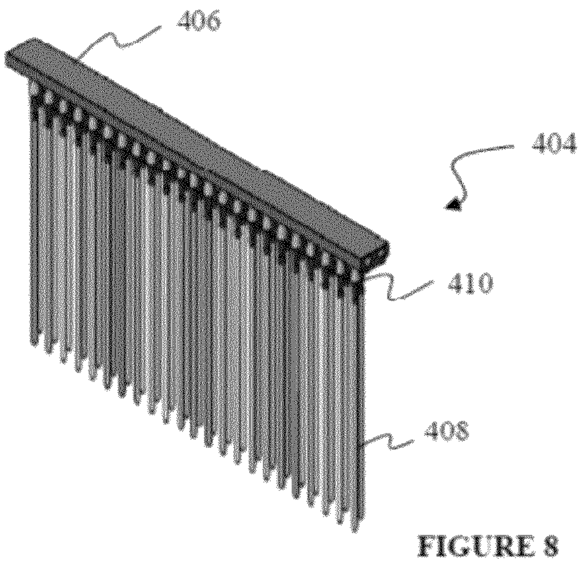
FIG. 8 is a perspective view of an individual device bar of FIG. 4.
Figure 9:
FIG. 9 is a side view of the device bar of FIG. 8.
Figure 9:
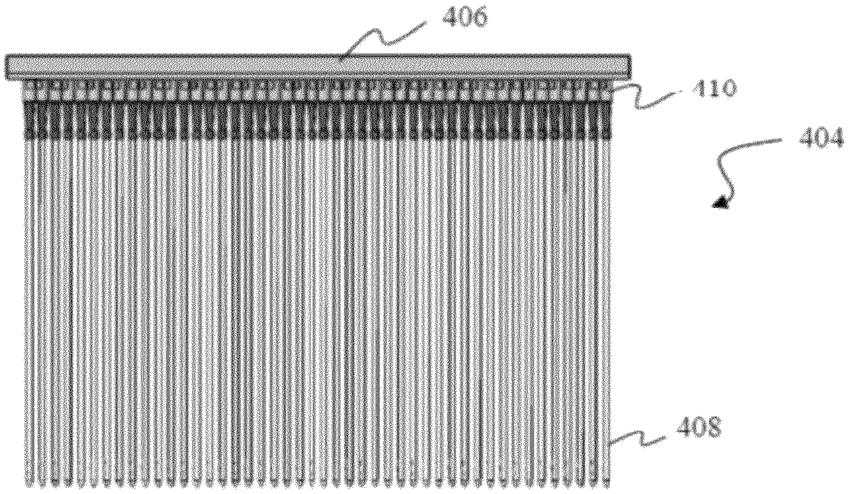
Figure 10:
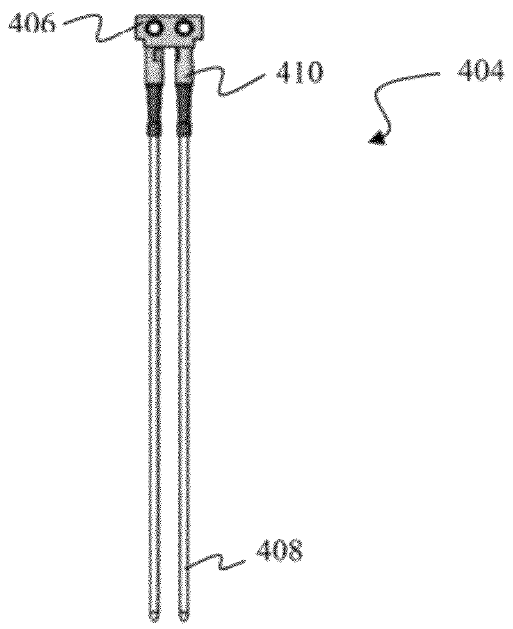
FIG. 10 is a front view of the device bar of FIG. 8.

In one non-limiting exemplary embodiment, and referring to FIGS. 4-10, an assembly 400 of coated articles comprises a pallet 402 supporting a plurality of elongate carrier members configured as device bars 404. Referring specifically to FIGS. 8-10, each device bar 404 comprises an elongate member configured as a bar 406 having a plurality of coated articles 408 removably coupled and suspended therefrom via a connector 410, such as a tube for insertion of article 408. In the case of catheters, each catheter is coupled to bar 406 on a first end. The catheters are staggered along bar 406 such that the catheters do not come into contact with one another, and so that there is minimal or no blocking or shadowing a side of one catheter by another catheter. In this particular embodiment, device bar 404 comprises 46 catheters per bar in two staggered rows of 23 catheters each. Device bar 406 has a length of about 27.31", however any of a number of dimensions can be contemplated depending upon the application and the desired throughput.

Referring back to FIGS. 4-7, once device bar 404 has been loaded, device bar 406 is operably coupled to pallet 402 via a plurality of positioning members configured as guides or tracks 412. Referring to FIG. 6, tracks 412 can comprise, for example, two extensions 414 from a surface of pallet 402, each extension having a flange 416. A length of each tract is equal to or slightly longer than the length of device bar 404, such as, for example, about 29.00". Device bar 404 is slidingly received in track 412 to load pallet 402. In one non-limiting exemplary embodiment of the invention, pallet 402 comprises nine tracks 412 spaced along a width of pallet 402, such that pallet 402 can support nine device bars 404 having 46 catheters for a total of 414 catheters per pallet. However, pallet 402 can be scaled up or down in any variety of configurations as desired.

Articles 408 are then coated with the desired coating by any of a variety of suitable techniques such as spray coating, dip coating, curtain coating or the like. Referring to FIG. 7, the catheters are spaced relative to one another such that they are never in contact with one another to prevent sticking to each other during processing.

Figure 11:
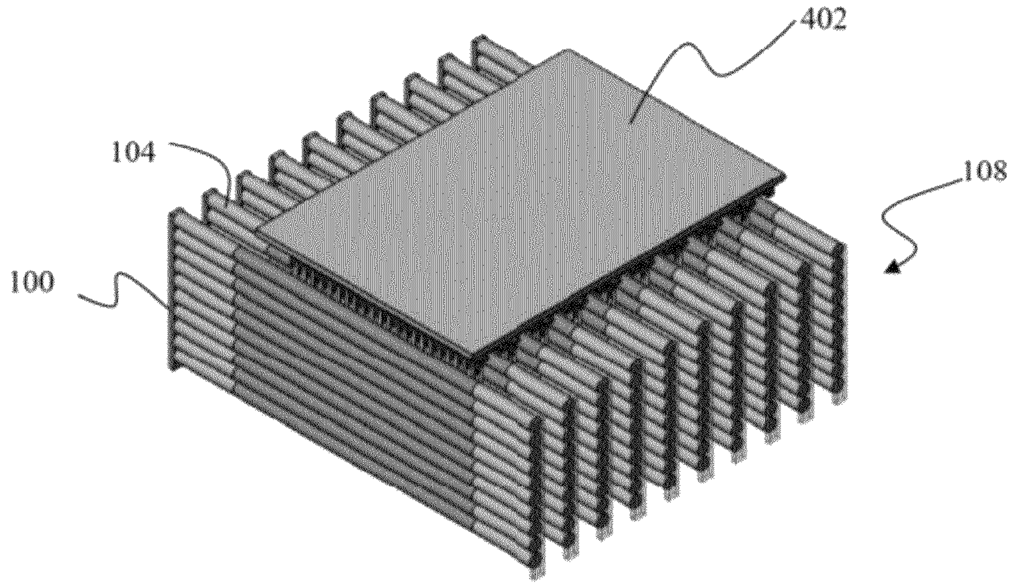
FIG. 11 is a perspective view of a combination of a device pallet of coated articles inserted into a UV curing system according to an embodiment of the invention.
Figure 12:
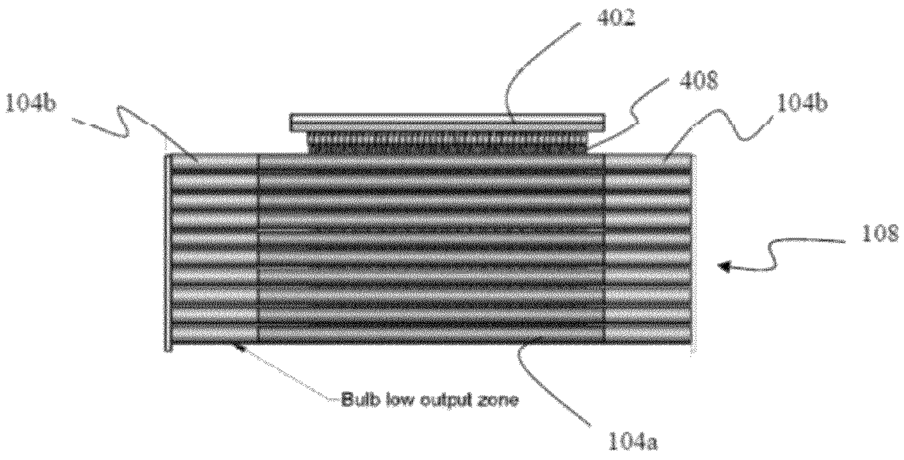
FIG. 12 is a side view of the combination of FIG. 11.
Figure 13:
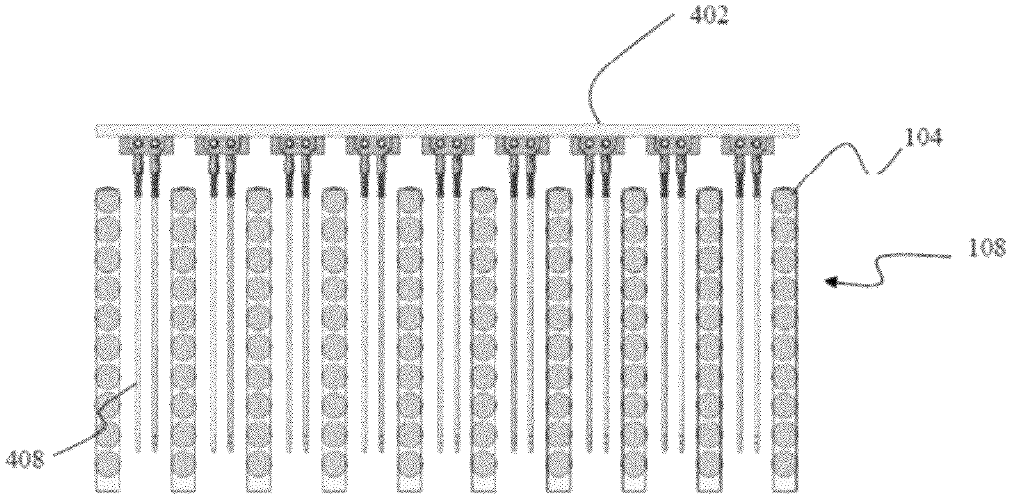
FIG. 13 is a front view of the combination of FIG. 11.

Referring to FIGS. 11-13, and according to one embodiment of the invention, in use, once articles 408 have been coated, pallet 402 is introduced into UV curing system 108 during a positioning phase such that each device bar 404 is positioned between two banks 100 and articles 408 extend between banks 100 such that articles 408 are proximate banks 100 without contacting banks 100, as illustrated in FIG. 13. Referring to FIG. 12, each bulb 104 comprises a high output zone 104*a* sandwiched between two low output zones 104*b* on each end. Pallet 402 with device bars 404 is sized such that articles 408 are suspended within only high output zone 104*a* to ensure adequate, consistent unshielded exposure to UV. This allows for substantially uniform UV exposure along a length of and around the article being cured resulting in a substantially uniform cure of the coating. This in turn, results in more consistent, predictable, and uniform coating properties along the length of and around the article, particularly in the instance when coating properties are highly dependent upon degree of cure of the coating.

Figure 22:
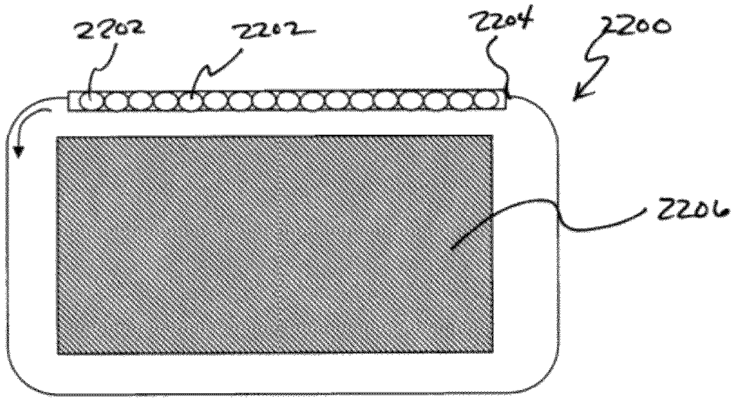
FIG. 22 is a plan view of a bank of bulbs on a guide member.

The introduction of articles 408 can be accomplished through movement of the articles 408 via pallet 402, and/or movement of UV curing system 108 using conventional automation techniques. In one alternative embodiment of the invention, not shown, the bulbs are placed on a rail or other conveying system. For example, as depicted in FIG. 22, a curing system 2200 includes a plurality of bulbs 2202 coupled vertically by at least one end to a guide member 2204, such as a rail, that is formed in a continuous loop. An article 2206 to be cured is placed in the center of rail 2204. Bulbs 2202 are then moved around the loop, while article 2206 is stationary or rotating in an opposite direction, thereby curing the coating. This embodiment is particularly advantageous for the curing of large parts, such as for example, automobile parts.

Figure 14:
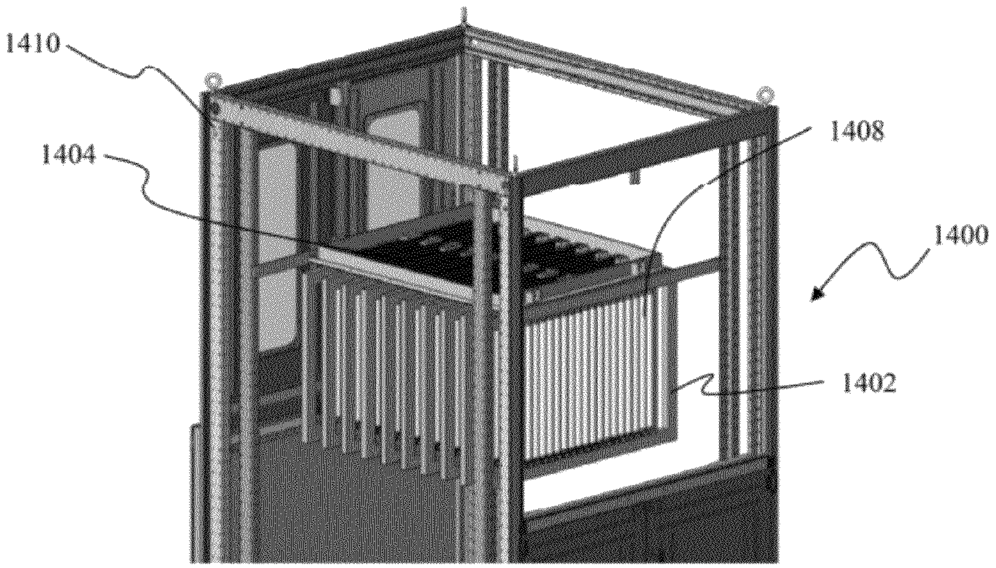
FIG. 14 is a perspective view of a combination of a device pallet of coated articles inserted into a UV curing system according to another embodiment of the invention.
Figure 16:
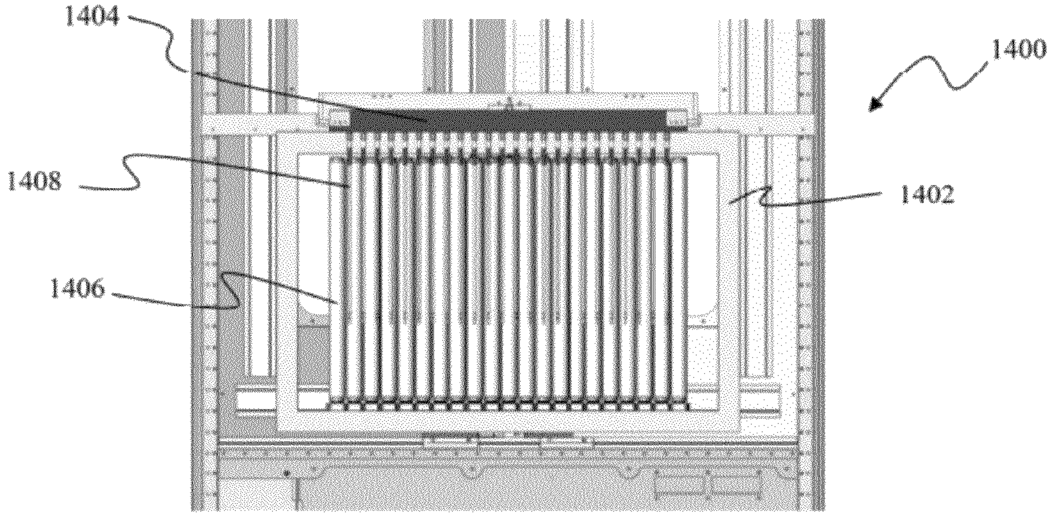
FIG. 16 is a cross-sectional side view of the combination of FIG. 14.
Figure 15:
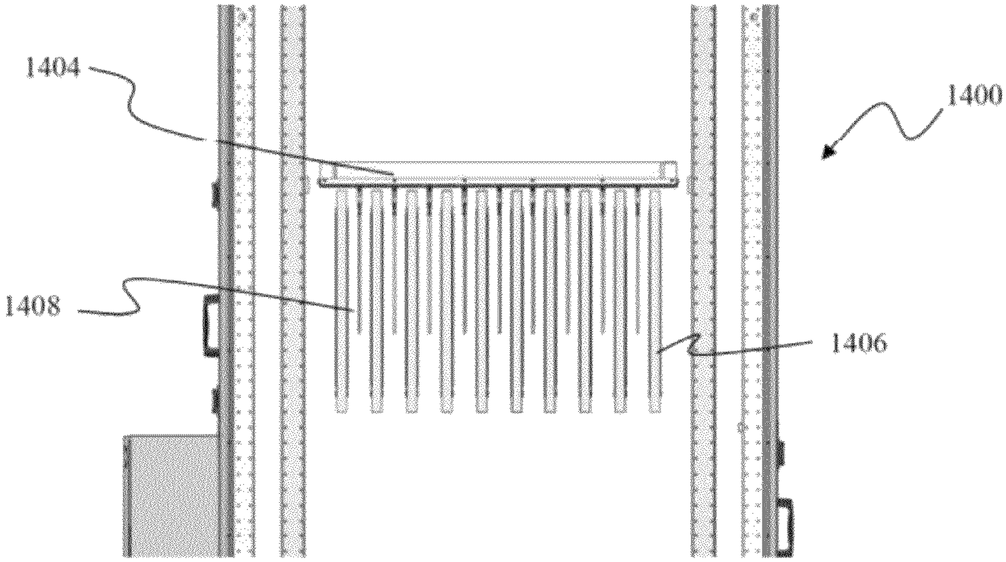
FIG. 15 is a front view of the combination of FIG. 14.

Referring to FIGS. 14-16, another embodiment of the invention, in use a UV curing system 1400 includes a plurality of UV banks 1402 positioned with pallet 1404 supported by a frame 1410. UV banks 1402 comprise a plurality of UV fluorescent bulbs 1406 arranged vertically. Articles 1408 supported by pallet 1404 as describe above, extend between banks 1402 and substantially parallel to bulbs 1406.

Figure 24:
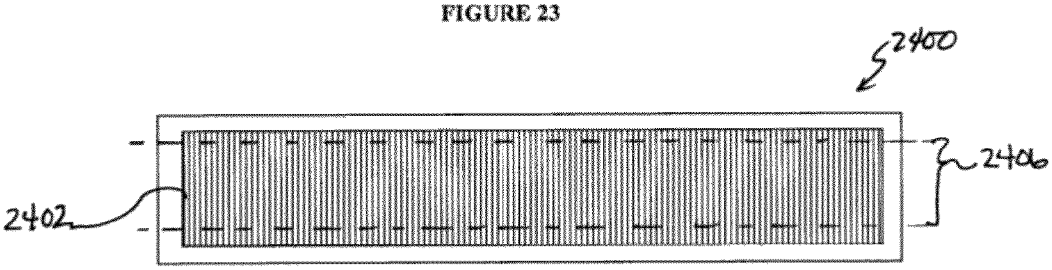
FIG. 24 is an elevational view of a tunnel of bulbs, the bulbs arranged vertically.

In an alternative embodiment of the invention, and referring to FIG. 24, a curing bank 2400 of a curing system includes a plurality of fluorescent UV bulbs 2402 positioned vertically and side-by-side to form a tunnel-like bank of lamps forming a wall of UV exposure without interrupting frame members or bulb ends. The article(s) to be cured move through the high output region 2406 of the bank. By placing the bulbs in vertical position, the length of the tunnel or bank is limitless without the need for correcting or compensating for low output regions between bulbs that would otherwise be present if bulbs were placed horizontally in an end-to-end configuration in multiple banks. The result is a continuous high output curing zone or tunnel.

Figure 27:
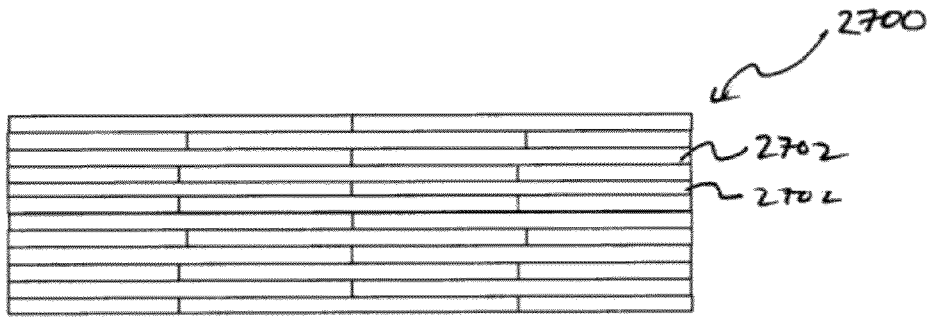
FIG. 27 is an elevational view of a tunnel of bulbs arranged horizontally and interleaved with one another.

In yet another alternative embodiment, and referring to FIG. 27, a curing bank 2700 of a curing system includes a plurality of fluorescent UV bulbs 2702 positioned horizontally and side-by-side in an interleaving fashion to form a tunnel-like bank of lamps forming a wall of UV exposure without interrupting frame members. By interleaving the bulbs, the high output regions of bulbs overlap with low output end regions of adjacent bulbs to compensate for the low output regions, thereby providing consistent cure. With this configuration, the length of the tunnel or bank is limitless without the need for correcting or compensating for low output regions between bulbs that would otherwise be present if bulbs were placed horizontally in a non-interleaved, end-to-end configuration in multiple banks. The result is a continuous high output curing zone or tunnel.

Figure 17:
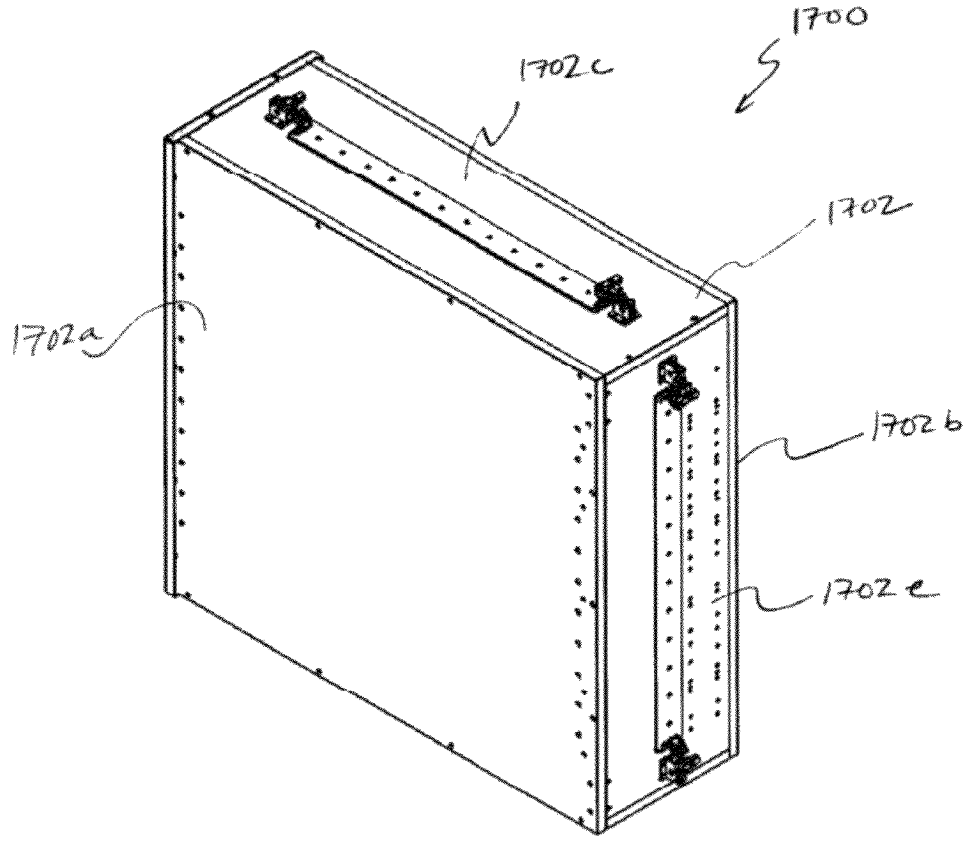
FIG. 17 is an isometric view of a UV curing chamber and device bar combination according to another embodiment of the invention.
Figure 18:
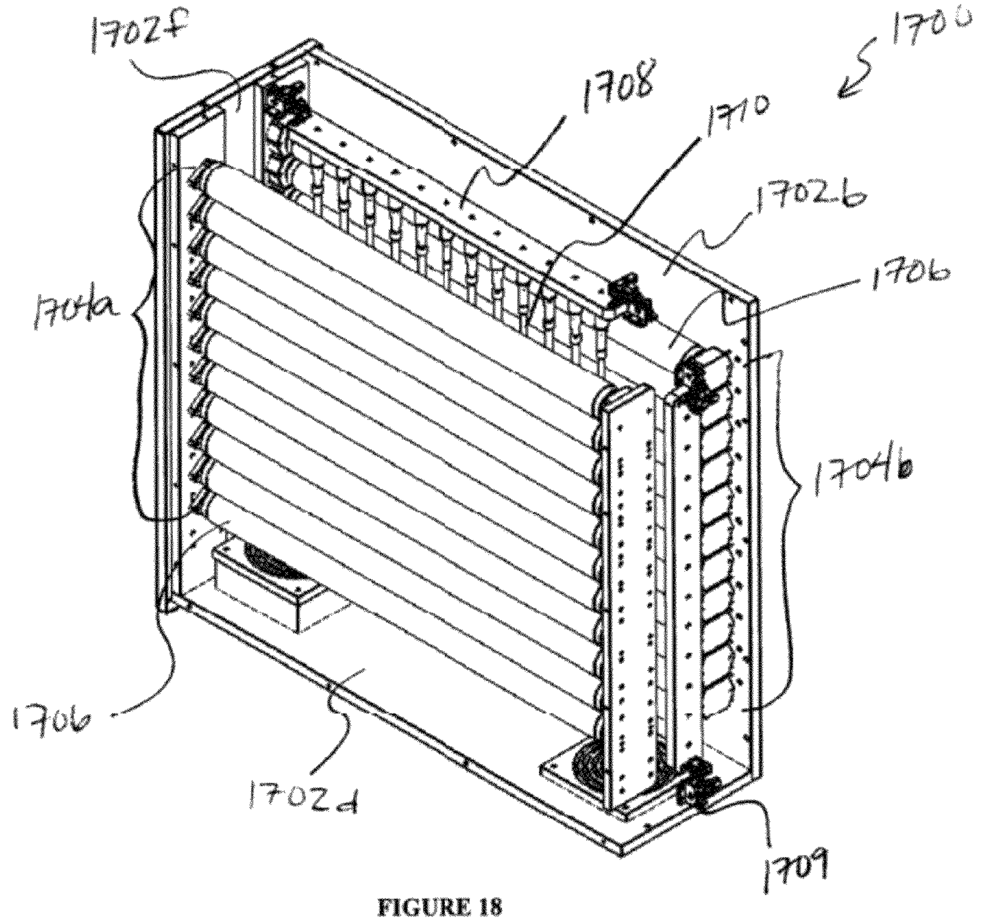
FIG. 18 is an isometric view the combination of FIG. 17 with front and side panels removed.
Figure 19:
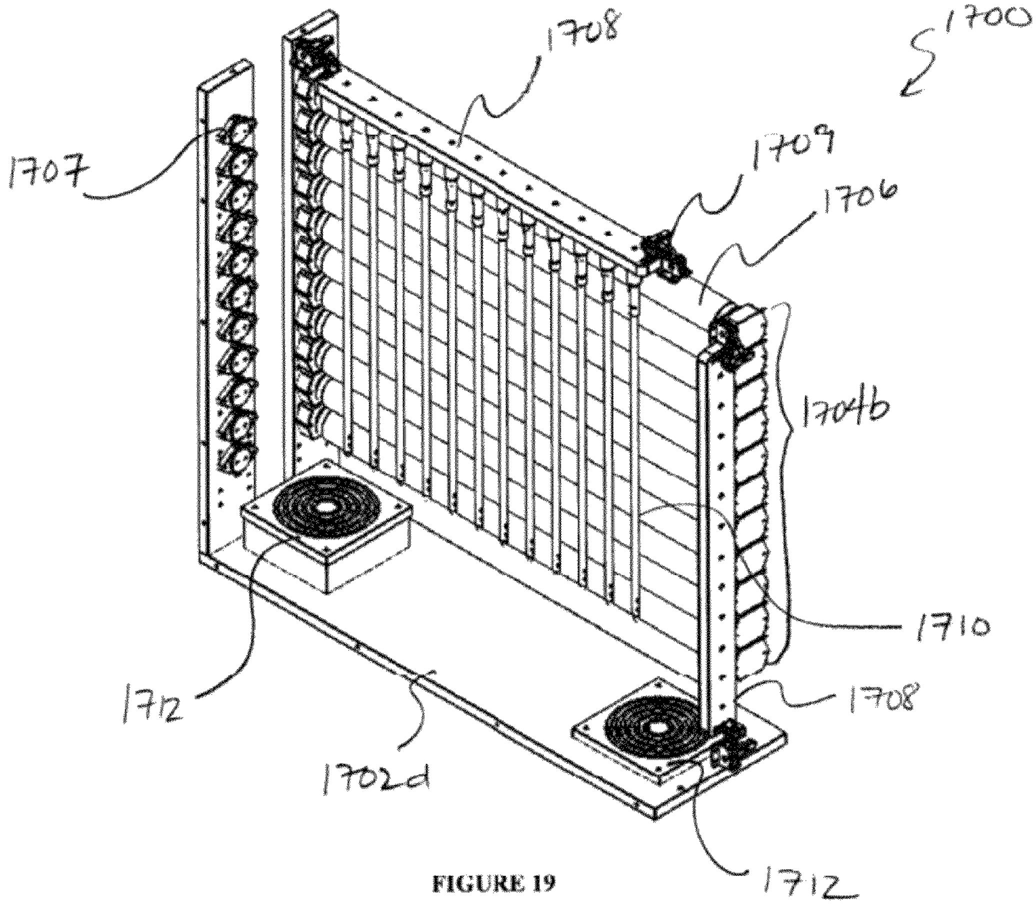
FIG. 19 is an isometric view of the combination of FIG. 18 with a first bank of lamps removed and back panel and remaining side panel removed.

Referring to FIGS. 17-19, and according to another non-limiting embodiment of the invention, system 1700 comprises a curing chamber including a housing 1702. Housing 1702 includes a front panel 1702*a*, a back panel 1702*b*, a top panel 1702*c*, a bottom panel 1702*d*, a first side panel 1702*e*, and a second side panel 1702*f*. Front panel 1702*a* can optionally be hingedly connected to side panel 1702*e* for access into an interior volume of housing 1702. A first bank 1704*a* of fluorescent UV lamps 1706 and a second bank 1704*b* of fluorescent UV lamps 1706 extend between side panels 1702*e* and 1702*f*, and are coupled to each side panel 1702*e* and 1702*f* via connecting pins extending from the ends of each lamp 1706 and outlets 1707 mounted on each side panel. Top panel 1702*c* and/or a side panel 1702*e*, 1702*f* includes an opening for accepting a device bar 1708 having a plurality of articles 1710 suspended therefrom. Articles 1710 extend between first bank 1704*a* and second bank 1704*b* when second bank 1704*b* is placed in a closed configuration with respect to first bank 1704*a*. Device bar 1708 is secured by clamps 1709.

Bottom panel 1702*d* can optionally include vents 1712 and fans (not shown) for cooling of chamber 1700.

FIGS. 17-19 depict device bar 1708 mounted through top panel 1702*c* such that articles 1710 extend substantially perpendicular to lamps 1706. However, device bar 1708 can alternatively be mounted through side panel 1702*e* such that articles 1710 extend substantially parallel to lamps 1706.

Curing cycle times of any of the systems described above can vary depending on the exposure required to cure the coating. Cycle times can range from about one minute or less to ten minutes or more depending on a number of factors including coating type, coating thickness, power setting of the bulbs, bulb type, and the like. For example, primers can cure in a minute or less, while hydrophilic coatings often required about 1.5 minutes or more. Because of the reduced heat generation of fluorescent UV bulbs, it is difficult to over-cure the coating, thereby reducing the occurrence of degradation or shrinking of the coating, and deformation of the article being cured.

In one embodiment of the invention, UV curing system 108 is powered on when the articles are introduced into the system, i.e. at the beginning of the cycle, and then turned off at the end of each cycle. In an alternative embodiment, UV curing system 108 is on continuously, which can actually increase the life of the bulbs because they are not powered up and down cyclically.

Optional UV shutters can be incorporated into the system to reduce UV exposure to the immediate surroundings and operators. Each individual bank 100 of system 108 can be shuttered, and/or the entire system 108 can be shuttered, as illustrated at by the box or enclosed framing of the system of FIGS. 17-19.

Figure 23:
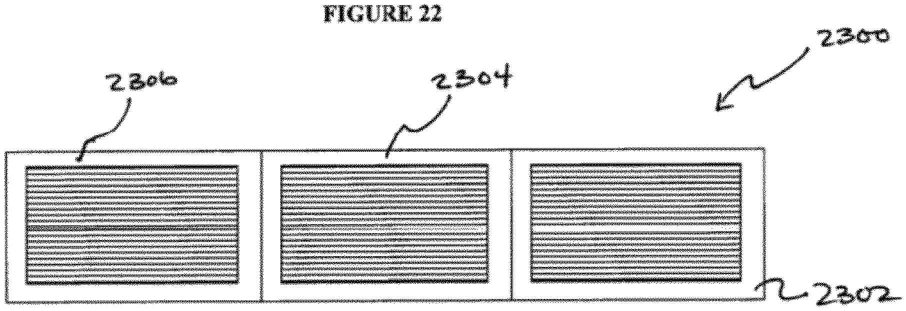
FIG. 23 is an elevational view of a tunnel of three banks of bulbs, the bulbs arranged horizontally.

In yet another embodiment of the invention, the banks of the systems can include different UV emitting bulbs and/or the systems can include banks of different UV-emitting bulbs. For example, a system can include one or more banks, each bank including at least two different UV-emitting bulbs, such as UV-A and UV-C emitting bulbs. The bulbs can be alternating, interleaving, or random order, or can be in groups of like bulbs. In one particular example, and referring to FIG. 23, a first bank 2302 in a wall of banks 2300 includes a plurality of a first type of bulb, whereas a second bank 2304 includes a plurality of a second type of bulb different than the first type. Optional additional bank(s) 2306 can include a plurality of bulbs either the same or different than the first type of bulbs, the second type of bulbs, or both. Therefore, as articles move through the tunnel, they are exposed to different "walls" of UV energy.

Figure 26:
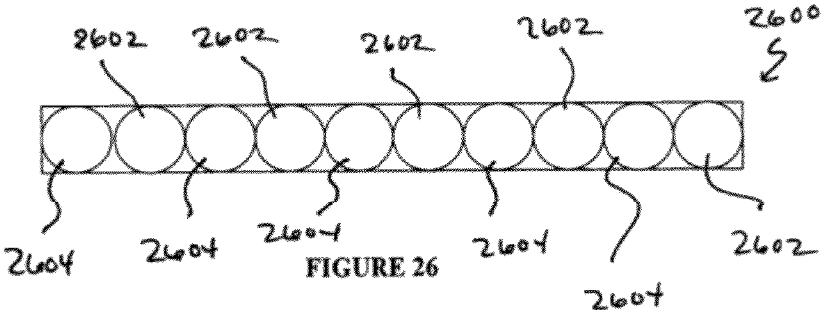
FIG. 26 is a plan view of a bank of bulbs including different bulb types.

In another example, an referring to FIG. 26, a bank 2600 comprises at least one of a first type of bulb 2602, and at least one of a second type of bulb 2604 different than the first type. The bulbs are depicted in alternating order in FIG. 26, but can be in random order or any of a number of different configurations.

Upon curing, the first type of bulbs are illuminated for a desired amount of time to initiate curing, and then the second type is turned on for additional cure (and optionally the first type is turned off), until all types of bulbs are cycled through. Alternatively, all bulbs are illuminated for different stages of cure, or illuminated sequentially and remaining on for the rest of the desired time.

UV bulbs can fail in one of three ways in a UV system. The first failure is catastrophic failure in which the bulb loses power or burns out. Second, the bulb can be out of range, i.e. dosage, wavelength, and/or frequency, for the particular coating system due to fluctuations or incorrect settings. Third, the bulbs can slowly loose energy over the life of the bulb, or can become dirty. Any of these failures can reduce the amount of cure and can result in an unsatisfactory or inconsistent product. Therefore, before introduction of articles 408 into system 108, and/or while curing is underway, dosimetry measurements of each bulb of each bank 100 can be conducted by use of one or more radiometers which measures the radiant flux or power of the UV energy. More particularly, a radiometer with a specific filter tuned to the desired wavelength of the lamps is passed through each bank of light to ensure that a consistent wall of UV dosage is being supplied within the system that is consistent with the desired dosage for curing the coating. In one particular embodiment of the invention, a radiometer is placed at one end of each bulb in a bank of bulbs. Before and/or during curing, the radiometer moves along the length of the bulb to gather real-time dosimetry data. The data can then be matched to a particular pallet of articles, and a particular set of articles on a pallet, such that in the event of a bulb failure, only selected articles can be failed rather than an entire pallet.

In the event of bulb failure, system 108 provides a more efficient means of maintenance than existing systems. Rather than replacing individual bulbs, which can be time consuming, an entire bank 100 is easily swapped out with a new bank. The swapped out banks can be repaired during scheduled downtime or by other operators so as to minimize downtown of system 108.

In order to maximize throughput of system 108 while ensuring adequate curing of the UV coating, a number of parameters in the system can be adjusted. UV dosage is a measure of UV intensity over a period of time. The UV intensity is the amount of energy per square centimeter received per second. As UV energy decreases as a square of the distance from the bulb to the article, the distance between the banks of lights can be varied. Also, the power of the bulbs can be varied as the power of a bulb is directly related to its length. Also, the power supplied to the system can also be varied. Furthermore, the UV lights can be doped to alter the frequency of a particular type of bulb in order to get more energy from the bulb without increasing the power to the bulb so as not to affect the life of the bulb. Any or all of these parameters can be varied in order to obtain adequate cure of a coating with optimized efficiency of the system.

Optionally, the system of banks of UV bulbs and/or the articles supported by the pallet can be rotated to produce a more consistent even coating. For example, once the articles are moved into position between the banks of lights, the articles, and optionally the banks as well can be rotated so that the coating does not flow to one end of the article during the cycle time due to gravity before it is fully cured. This feature may be particularly advantageous when coatings of lower viscosity, such as solvent-based coatings, are used. Alternatively, the banks of articles may be rotated before being intermeshed within the banks of UV fluorescent bulbs.

Figure 20:
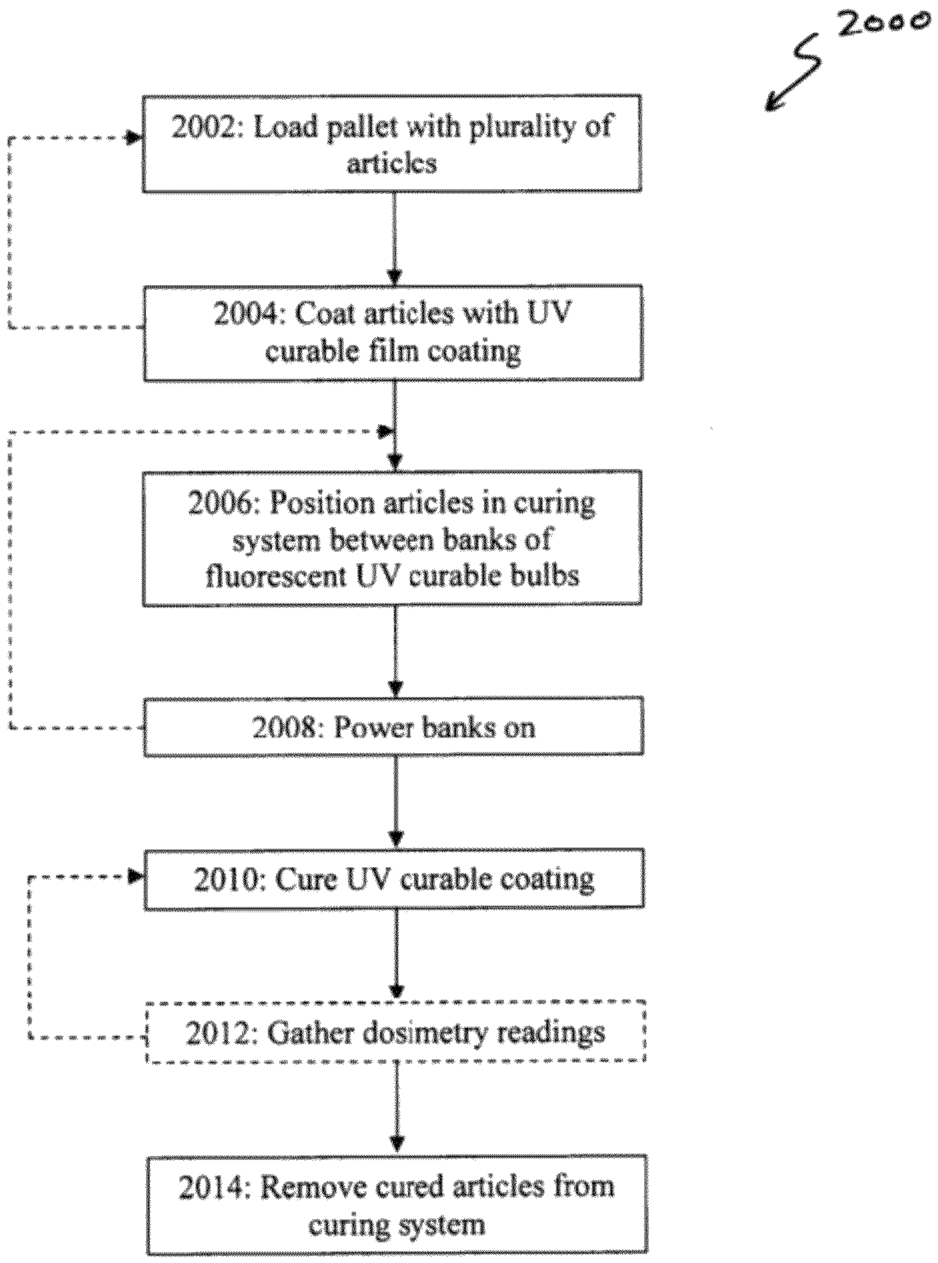
FIG. 20 is a block diagram depicting a method of curing an article according to an embodiment of the invention.

In one exemplary embodiment, and referring to FIG. 20, a method of use 2000 includes loading a pallet 2002 with a plurality of articles. The articles are coated with a UV curable film coating 2004 either before or after loading of the pallet. The articles are then positioned within a fluorescent UV curing system 2006, such as those described in the above embodiments, such that the articles are placed between two adjacent banks of bulbs, each bank including a plurality of fluorescent UV bulbs in a plane. The banks of bulbs are powered on 2008 either before or after positioning of the articles therebetween. The articles are exposed to the blanket of UV radiation generated within each area for a desired time to adequately cure the UV curable coating 2010. Optionally, dosimetery measurements are made 2012 either before or during the curing time. The articles are then removed 2014 from the curing system.

The systems described above include a number of advantages over the currently used UV curing systems. The systems provide for mass scale-up of curing operations because a number of articles can be cured in a single cycle, thereby significantly increasing the throughput of the system without compromising the quality of the coating. The configuration of the grid or matrix of UV lamps provides unshielded UV exposure or access to all the articles evenly. The use of fluorescent UV bulbs provides long bulb life and lower power requirements, thereby reducing the energy costs of the system. The systems are compact in size, thereby reducing the cost of scale-up. Finally, the systems are easily maintained by the swapping out of entire banks, rather than individual bulbs, thereby minimizing downtime, and maximizing throughput.

In certain non-limiting, exemplary embodiments, the walls of UV fluorescent bulbs will have a spacing of between 1/16 of an inch and 1 and 1/4 of an inch between adjacent bulbs. In another embodiment the spacing between adjacent bulbs will be 1/8 of an inch to 3/4 of an inch. In an embodiment the walls defining a curing slot for the row of elongate articles to be treated will have a spacing of between 3 to 4 inches. In another embodiment the spacing will be between 2 and 6 inches. In an embodiment the fluorescent bulbs will be longer than the articles being cured. In an embodiment the fluorescent bulbs will be at least 10% longer that the articles being cured. In an embodiment the fluorescent bulbs will be at least 20% longer that the articles being cured. In an embodiment of the invention, each bank of UV fluorescent bulbs has at least 6 bulbs. In an embodiment of the invention, each bank of UV fluorescent bulbs has at least 8 bulbs. In an embodiment of the invention, each bank of UV fluorescent bulbs has at least 10 bulbs. In an embodiment of the invention, each bank of UV fluorescent bulbs has at least 12 bulbs. In an embodiment of the invention each curing chamber has at least 2 banks of fluorescent bulbs. In an embodiment of the invention each curing chamber has at least 3 banks of fluorescent bulbs. In an embodiment of the invention each curing chamber has at least 4 banks of fluorescent bulbs. In an embodiment of the invention each curing chamber has at least 6 banks of fluorescent bulbs. In an embodiment of the invention each curing chamber has at least 10 banks of fluorescent bulbs. However, any combination and configuration can be considered depending on the desired curing capabilities and capacities with degrees of freedom including horizontal or vertical positioning of bulbs, number of bulbs per bank, number of banks per chamber, length of the bulbs, properties of the bulbs (e.g. emitting wavelength), and the like.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art.

The invention claimed is:

1. A fluorescent UV curing system comprising:

a first light bank comprising a first plurality of fluorescent UV bulbs extending substantially parallel to one another and arranged side-by-side, the first light bank presenting a height, a length, and a width defined as extending between a first plane defined as the outermost extending portions of bulbs on a first side of the first light bank, to a second plane defined by the outermost extending portions of the bulbs on a second side of the first light bank, wherein the first plurality of fluorescent UV bulbs emits a first zone of substantially uniform curing energy at a first distance spaced from the first plane, and along at least a portion of the height and the length of the first light bank; further comprising:

a second light bank comprising a second plurality of fluorescent UV bulbs extending substantially parallel to one another and arranged side-by-side, the second light bank presenting a height, a length, and a width defined as extending between a first plane defined as the outermost extending portions of bulbs on a first side of the second light bank, to a second plane defined by the outermost extending portions of the bulbs on a second side of the second light bank, wherein the second light bank is positioned substantially parallel to and spaced from the first light bank, wherein the second plurality of fluorescent UV bulbs emits a second zone of substantially uniform curing energy at a second distance spaced from the first plane of the second light bank, and along at least a portion of the height and the length of the second light bank; and wherein the first zone of substantially uniform curing energy and the second zone of substantially uniform curing energy define a curing zone.

2. The curing system of claim 1, further comprising a housing including a front panel, a back panel, a top panel, a bottom panel, and two side panels, wherein the first bank is coupled to and extends between the two side panels adjacent the front panel, and wherein the second bank is coupled to and extends between the two side panels adjacent to the back panel.

3. The curing system of claim 2, wherein at least one of the top panel and a side panel includes structure defining an opening adapted for removably receiving a plurality of coated articles, such that the articles extend within the housing between the first and second light banks.

4. The curing system of claim 3, wherein the front panel is hingedly coupled to one of the side panels such that the front panel is selectively shifted from an open position in which access to an interior of the housing is allowed, and a closed position in which the first and second banks are sealed within the housing.

5. A method of curing articles, the method comprising:

providing a first light bank comprising a first plurality of fluorescent UV bulbs extending substantially parallel to and arranged side-by-side to one another;

providing a second light bank comprising a second plurality of fluorescent UV bulbs extending substantially parallel to and arranged side-by-side to one another, wherein the second light bank is positioned substantially parallel to and spaced from the first light bank;

positioning a first plurality of elongate articles having UV curable film coatings in between the first light bank and the second light bank; and curing the UV curable film coatings by powering on the first light bank and the second light bank.

6. The method of claim 5, wherein the first and second pluralities of fluorescent UV bulbs are positioned substantially perpendicular to the first plurality of elongate articles.

7. The method of claim 5, wherein the first and second pluralities of fluorescent UV bulbs are positioned substantially parallel to the first plurality of elongate articles.

8. The method of claim 5, wherein the first plurality of fluorescent UV bulbs emits a first zone of substantially uniform curing energy at a first surface or side of the elongate articles positioned proximate the first light bank, and wherein the second plurality of fluorescent UV bulbs emits a second zone of substantially uniform curing energy at a second surface or side of the elongate articles positioned proximate the second light bank.

9. The method of claim 8, wherein the first and second zones of substantially uniform curing energy extends an entirety of a length of each of the elongate articles having the UV curable coating thereon.

10. The method of claim 5, further comprising:

providing a third light bank comprising a third plurality of fluorescent UV bulbs extending substantially parallel to and arranged side-by-side to one another in a third plane, wherein the third light bank is positioned substantially parallel to and spaced from the second light bank; and positioning a second plurality of elongate articles having UV curable film coatings in between the second light bank and the third light bank; and curing the UV curable film coatings of the second plurality of elongate articles by powering on the third light bank.

11. The method of claim 5, wherein, or combinations thereof, and wherein the UV curable film coatings comprise a photoinitiator adapted to absorb UV energy at wavelengths emitted from the first light bank and second light bank.

12. The method of claim 5, wherein positioning the first plurality of elongate articles between the first light bank and the second light bank comprises removably placing the first plurality of elongate articles between the first and second light banks for a period of time.

13. The method of claim 5, wherein positioning the first plurality of elongate articles between the first light bank and the second light bank comprises keeping the first plurality of elongate articles stationary, while moving the first and second light banks into position relative to the first plurality of elongate articles for a period of time.

14. A fluorescent UV curing system comprising:

a support structure holding a plurality of fluorescent UV light banks, each light bank comprising a framework supporting a plurality of elongate linear fluorescent UV bulbs, the bulbs of each light bank extending substantially parallel to one another and arranged side-by-side, each light bank presenting a height, a length, a first side, a second side, at least one of said first and second side being a UV projecting side having the plurality of UV bulbs exposed for projecting UV light energy from said at least one side, wherein each UV projecting side has an optimal curing zone spaced from the respective light bank, wherein the plurality of UV light banks are arranged in an aligned row wherein said UV curing system has at least one pair of adjacent parallel UV light banks, and wherein for each adjacent pair, respective UV projecting sides are facing each other, and wherein the optimal curing zone of respective UV projecting sides are overlapping each other defining a curing region that receives UV from each of the respective UV projecting sides;

the support structure providing access and the system defining a receiving region for insertion and receiving of a device carrier whereby devices held by the device carrier are positioned within the curing region.

15. The curing system of claim 14, wherein the system comprises "x" number of light banks, x being at least 2, and "x−1" number of curing zones, whereby when x is greater than 2, the light banks comprise end light banks and at least one intermediate light bank, each intermediate light bank having two UV projecting sides.

16. The curing system of claim 14, wherein a length of each bulb of the plurality of elongate fluorescent UV bulbs of a light bank extends substantially parallel to the length of the light bank such that the length of the light bank is equal to or greater than the length of the bulb.

17. The curing system of claim 14, wherein the distance of the spacing of adjacent light banks is in a range from about three to about six inches.

18. The curing system of claim 14, wherein the distance of the optimal curing zone is in a range from about 0.5 to about four inches from the light bank on the UV projecting side.

19. The curing system of claim 14, wherein at least one of the top panel and a side panel includes structure defining an opening adapted for removably receiving a plurality of coated articles, such that each of the articles extend within the housing, and between adjacent light banks within a curing zone.

* * * * *